United States Patent
Schwandner

(10) Patent No.: US 8,376,810 B2
(45) Date of Patent: Feb. 19, 2013

(54) METHOD FOR CHEMICALLY GRINDING A SEMICONDUCTOR WAFER ON BOTH SIDES

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 346 days.

(21) Appl. No.: 12/754,831

(22) Filed: Apr. 6, 2010

(65) Prior Publication Data

US 2010/0323585 A1    Dec. 23, 2010

(30) Foreign Application Priority Data

Jun. 17, 2009    (DE) .................. 10 2009 025 242

(51) Int. Cl.
*B24B 1/00*    (2006.01)
(52) U.S. Cl. .............. 451/41; 451/57; 451/60; 451/262
(58) Field of Classification Search .............. 451/57, 451/63, 60, 285–290, 261, 262, 269, 41; 261/88; 438/692
See application file for complete search history.

(56) References Cited

U.S. PATENT DOCUMENTS

| | | | |
|---|---|---|---|
| 3,807,979 A * | 4/1974 | Cromwell ................... | 51/308 |
| 3,905,162 A | 9/1975 | Lawrence et al. | |
| 4,831,784 A * | 5/1989 | Takahashi ................... | 451/288 |
| 5,400,548 A | 3/1995 | Huber et al. | |
| 5,771,876 A | 6/1998 | Egglhuber | |
| 5,964,651 A * | 10/1999 | Hose ............................ | 451/262 |
| 6,007,407 A | 12/1999 | Rutherford et al. | |
| 6,019,672 A | 2/2000 | Damgaard | |
| 6,096,107 A | 8/2000 | Caracostas et al. | |
| 6,159,284 A | 12/2000 | Olkrug et al. | |
| 6,190,240 B1 * | 2/2001 | Kinoshita et al. ............... | 451/56 |
| 6,214,704 B1 | 4/2001 | Xin | |
| 6,234,875 B1 * | 5/2001 | Pendergrass, Jr. .............. | 451/41 |
| 6,361,407 B1 * | 3/2002 | Lu et al. ........................... | 451/41 |
| 6,383,060 B2 * | 5/2002 | Kawasaki et al. ............... | 451/41 |
| 6,464,562 B1 * | 10/2002 | Chen ............................... | 451/5 |
| 6,599,177 B2 | 7/2003 | Nevoret et al. | |
| 6,602,117 B1 | 8/2003 | Chopra et al. | |
| 6,645,862 B2 * | 11/2003 | Wenski et al. ................. | 438/691 |
| 6,793,837 B2 * | 9/2004 | Wenski et al. .................. | 216/88 |
| 6,884,154 B2 * | 4/2005 | Mizushima et al. ............ | 451/44 |
| 7,108,583 B1 | 9/2006 | Heilmaier et al. | |
| 7,354,332 B2 * | 4/2008 | Surana et al. ..................... | 451/5 |
| 7,589,023 B2 | 9/2009 | Taniguchi et al. | |
| 7,815,489 B2 * | 10/2010 | Pietsch et al. ...................... | 451/7 |
| 8,113,913 B2 * | 2/2012 | Pietsch et al. ...................... | 451/7 |
| 2001/0014570 A1 | 8/2001 | Wenski et al. | |
| 2002/0077039 A1 * | 6/2002 | Wenski et al. ................... | 451/41 |
| 2003/0045212 A1 * | 3/2003 | Lee et al. ......................... | 451/56 |

(Continued)

FOREIGN PATENT DOCUMENTS

| | | |
|---|---|---|
| DE | 10004578 C1 | 7/2001 |
| DE | 10344602 A1 | 5/2005 |

(Continued)

*Primary Examiner* — George Nguyen
(74) *Attorney, Agent, or Firm* — Brooks Kushman P.C.

(57) ABSTRACT

A semiconductor wafer processed on both sides simultaneously, the wafer lying in freely movable fashion in a cutout in one of a plurality of carriers that rotate by means of a rolling apparatus, and one thereby being moved on a cycloidal trajectory, the semiconductor wafer being processed in material-removing fashion between two rotating ring-shaped working disks, wherein each working disk comprises a working layer comprising abrasive material, and wherein an alkaline medium comprising no abrasive material is supplied during the processing.

20 Claims, 1 Drawing Sheet

1 Average removal of the wafer [μm/min]
2 Removal in the center of the wafer [μm/min]

U.S. PATENT DOCUMENTS

| | | | |
|---|---|---|---|
| 2003/0054650 A1* | 3/2003 | Wenski et al. | 438/692 |
| 2003/0077995 A1* | 4/2003 | Li et al. | 451/528 |
| 2003/0104698 A1 | 6/2003 | Taniguchi et al. | |
| 2003/0139122 A1* | 7/2003 | Lawing | 451/288 |
| 2004/0029489 A1* | 2/2004 | Tsujimura et al. | 451/5 |
| 2004/0072437 A1* | 4/2004 | Iizuka et al. | 438/693 |
| 2004/0229548 A1* | 11/2004 | Kann et al. | 451/28 |
| 2005/0227590 A1 | 10/2005 | Sung | |
| 2007/0218807 A1* | 9/2007 | Mahadev et al. | 451/5 |
| 2008/0014839 A1 | 1/2008 | Pietsch et al. | |
| 2009/0011681 A1* | 1/2009 | Koike et al. | 451/36 |
| 2009/0029552 A1 | 1/2009 | Schwandner et al. | |
| 2009/0298394 A1* | 12/2009 | Katoh et al. | 451/41 |
| 2010/0009605 A1 | 1/2010 | Taniguchi et al. | |

FOREIGN PATENT DOCUMENTS

| | | |
|---|---|---|
| DE | 102005012446 A1 | 9/2006 |
| DE | 102006032455 A1 | 4/2008 |
| DE | 102007035266 A1 | 1/2009 |
| EP | 0955126 A2 | 4/1999 |
| EP | 0962284 A1 | 5/1999 |
| EP | 1 717 001 A1 | 2/2006 |
| JP | 2000280155 A | 10/2000 |
| JP | 2001-308038 A | 11/2001 |
| JP | 2002-231669 A | 8/2002 |
| JP | 2002307303 A | 10/2002 |
| JP | 2004071833 A | 3/2004 |
| WO | 9213680 | 8/1992 |

* cited by examiner

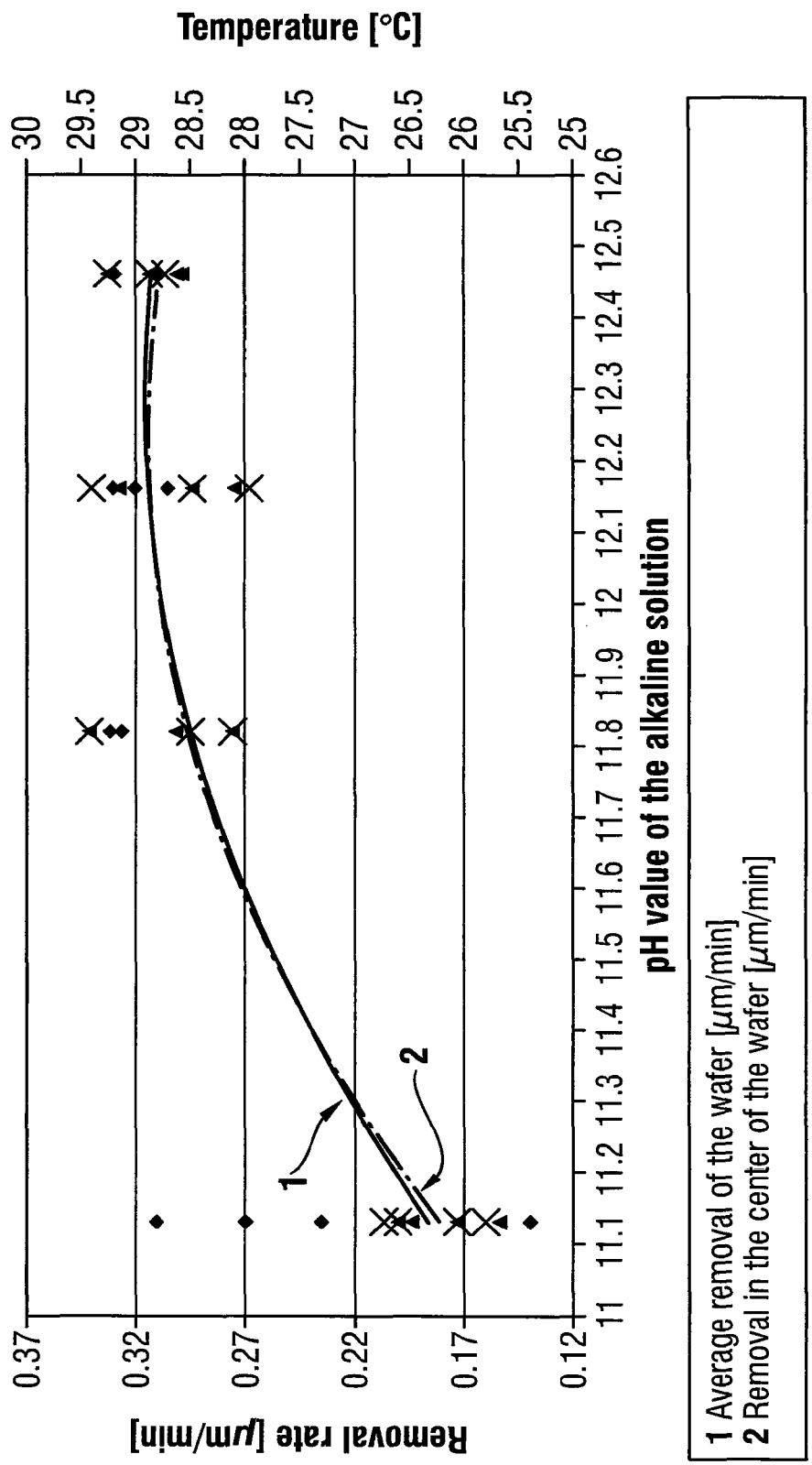

METHOD FOR CHEMICALLY GRINDING A SEMICONDUCTOR WAFER ON BOTH SIDES

CROSS-REFERENCE TO RELATED APPLICATIONS

This application claims priority to German Patent Application No. 10 2009 025 242.8 filed Jun. 17, 2009 which is herein incorporated by reference.

BACKGROUND OF THE INVENTION

1. Field of the Invention

The invention relates to a method for chemically grinding a semiconductor wafer on both sides. In particular, the invention is directed to a novel processing step for silicon wafers of the next technology generations, primarily having a diameter of 450 mm.

2. Background Art

At present, polished or epitaxially coated silicon wafers having a diameter of 300 mm are used for the most demanding applications in the electronics industry. The silicon wafers having a diameter of 200 mm are gradually being superseded by the 300 mm wafers.

A major reason why the electronics industry demands larger substrates for producing the components in this industry, be they microprocessors or memory chips, resides in the enormous economic advantage that this affords. In the semiconductor industry it has long been customary to focus attention on the available substrate area, or in other words to ask the question of how high is the number of components, that is to say logic chips or memory chips, which can be accommodated on an individual substrate. This is associated with the fact that a large number of processing steps by the component manufacturers are directed to the entire substrate, but also in addition, to individual steps for patterning the substrates, that is to say the production of component structures that subsequently lead to the individual chips. Thus, both groups of processing steps are closely related to the substrate size with regard to the production costs. The substrate size thus considerably influences the production costs per component and is thus of immense economic importance.

However, an increase in the substrate diameter is accompanied by major, in part also totally new, hitherto unknown technical problems.

Ultimately, all the processing steps, whether they be purely mechanical (sawing, grinding, lapping), chemical (etching, cleaning) or else chemical-mechanical in nature (polishing), and also the thermal processes (epitaxial coating, annealing) require thorough reworking, in particular also with regard to the machines and installations used therefor (equipment).

Chemomechanical processing comprises polishing methods in which a material removal is obtained by means of relative movement of semiconductor wafer and polishing pad with the action of force and with the supply of a polishing slurry (for example alkaline silica sol). The prior art describes batch double-side polishing (DSP) and batch and individual wafer single-side polishing (mounting of the semiconductor wafers by means of vacuum, adhesive bonding or adhesion during the polishing processing on one side on a support).

Mechanical processing steps in accordance with the prior art are lapping (simultaneous double-side lapping of a plurality of semiconductor wafers in the "batch"), single-side grinding of individual semiconductor wafers with single-side clamping of the workpieces (usually carried out as sequential single-side grinding of both sides of the wafer, "single-side grinding", SSG; "sequential SSG") or simultaneous double-side grinding of individual semiconductor wafers between two grinding disks (simultaneous "double-disk grinding", DDG).

Methods and apparatuses for the single-side surface grinding of a semiconductor wafer are known for example from U.S. Pat. No. 3,905,162 and also U.S. Pat. No. 5,400,548 or EP-0955126. In this case, a semiconductor wafer is fixedly held on a wafer holder by one of its surfaces, while its opposite surface is processed by means of a grinding disk by wafer holder and grinding disk rotating and being pressed against one another. In this case, the semiconductor wafer is fixed on the wafer holder in such a way that its center substantially corresponds to the rotation center of the wafer holder. Moreover, the grinding disk is positioned in such a way that the rotation center of the semiconductor wafer presses into a working region or the edge region of the grinding disk, the edge region being formed by teeth. The entire surface of the semiconductor wafer can thereby be ground without any movement in the grinding plane.

DDG machines according to the prior art, as are described for example in JP2000-280155A and JP2002-307303A, have two grinding wheels which lie opposite one another and the rotation axes of which are arranged colinearly. During the grinding operation, a workpiece in wafer form which is positioned between the grinding wheels is processed on both sides simultaneously by the two grinding wheels rotating about their axis, while it is held in position by a ring-shaped holding and rotation device and at the same time rotated about its own axis. During the grinding operation, the two grinding wheels are advanced in an axial direction until the desired final thickness of the workpiece has been reached.

The holding and rotation device may, for example, comprise friction wheels which engage on the edge of the workpiece. However, it may also be a device which surrounds the workpiece in ring-shaped fashion and engages in a score, groove or notch which is possibly present at the periphery of the workpiece. A device of this type is generally referred to as a "notch finger". In order to process the entire area of the workpiece, the workpiece is guided relative to the grinding wheels in such a way that the abrasive grinding segments of the grinding wheels describe a circular path which runs constantly over the center of the workpiece.

In this case, the workpiece is not generally in a fixed position, but rather is held axially in position by two apparatuses for hydrostatic bearing, referred to hereinafter as "hydropads", which are fitted on both sides of the workpiece. Apparatuses of this type are described in JP2000-280155A. In accordance with the prior art, those surfaces of the two hydropads which face the workpiece are configured in planar fashion and oriented parallel to one another. Each hydropad comprises a plurality of hydrostatic bearings, between which grooves for discharging the medium used for the hydrostatic bearing (referred to hereinafter as the "hydro-bearing medium") and the grinding coolant are arranged.

For producing particularly planar semiconductor wafers, great importance is ascribed to those processing steps in which the semiconductor wafers are processed largely in a constrained-force-free manner in "free-floating" fashion without force-locking or positively locking clamping ("free-floating processing", FFP). Undulations such as are produced for example by thermal drift or alternating load in MWS are eliminated by FFP particularly rapidly and with little loss of material. FFP processes known in the prior art include lapping, DDG and DSP, inter alia.

DE 103 44 602 A1 discloses a further mechanical FFP processing method, in which a plurality of semiconductor wafers lie in a respective cutout in one of a plurality of carriers that are caused to rotate by means of a ring-shaped outer and a ring-shaped inner drive ring, and are thereby held by a specific geometrical path and processed in material-removing fashion between two rotating working disks coated with bonded abrasive. This method is also called "planetary pad grinding" or simply PPG. The abrasive is composed of a film or "pad" stuck to the working disks of the apparatus used, as disclosed in U.S. Pat. No. 6,007,407, for example.

Hard materials are used as the abrasive, e.g. diamond, silicon carbide (SiC), cubic boron nitride (CBN), silicon nitride ($Si_3N_4$), cerium dioxide ($CeO_2$), zirconium dioxide ($ZrO_2$), corundum/aluminum oxide/sapphire ($Al_2O_3$) and many other ceramics having grain sizes up to a few tens of micrometers. For the processing of silicon, in particular diamond is preferred, and furthermore also $Al_2O_3$, SiC and $ZrO_2$. The diamond is incorporated, as individual grains, or bonded by means of a ceramic, metallic or synthetic resin primary bond to form conglomerates, into the ceramic, metal or synthetic resin matrix of the abrasive bodies.

DE 103 44 602 A1 furthermore discloses a method in which either a multiplicity of abrasive bodies containing bonded abrasive are stuck to the working disks or in which the abrasive is bonded in a layer or a "pad" and pads of this type are stuck to the working disk. There are furthermore fixings of the working layer by means of vacuum, screwing, covering or by means of hook and loop fastening, in electrostatic or magnetic fashion (see e.g. U.S. Pat. No. 6,019,672 A).

Sometimes the working layers are embodied as pads or laminated sheets (U.S. Pat. No. 6,096,107 A, U.S. Pat. No. 6,599,177 B2). Sheets having structured surfaces are also known, comprising elevated regions that come into contact with the workpiece and recessed regions via which cooling lubricant can be supplied and abrasive slurry and spent grain can be discharged. An abrasive tool (abrasive pad) structured in this way is disclosed by U.S. Pat. No. 6,007,407 A, for example. Here the abrasive pad is self-adhesive on the rear side, which permits a simple change of the abrasive tool on the working disk.

Suitable apparatuses for carrying out the processing methods of lapping, DSP and PPG essentially comprise a ring-shaped upper and lower working disks and a rolling apparatus comprising toothed rings arranged on the inner edge and on the outer edge of the ring-shaped working disks. Upper and lower working disks and inner and outer toothed rings are arranged concentrically and have colinear drive axes. The workpieces are introduced into thin guide cages which are toothed on the outside, so-called "carriers", which are moved between the two working disks during processing by means of the rolling apparatus. In the case of PPG, the working disks comprise, as mentioned above, a working layer with fixedly bonded abrasive.

In the case of lapping, use is made of working disks, so-called lapping plates, composed of cast material, generally a steel casting, e.g. ductile gray cast iron. These contain in addition to iron and carbon a multiplicity of nonferrous metals in different concentrations.

In the case of DSP, the working disks are covered with a polishing pad, wherein the polishing pad is composed for example of a thermoplastic or heat-curable polymer. A foamed plate or a felt or fiber substrate which is impregnated with a polymer is also suitable. In the case of lapping and DSP, lapping and polishing agents, respectively, are additionally supplied, but not in the case of PPG. For lapping, oils, alcohols and glycols are known as carrier liquids for the lapping agent (abrasive substance slurry, abrasive substances), also called a "slurry". For DSP, aqueous polishing agents to which silica sol is applied are known, which are preferably alkaline and, if appropriate, contain further additives such as chemical buffer systems, surfactants, complexing agents, alcohols and silanols.

The production of a semiconductor wafer comprises slicing the semiconductor wafer from a crystal followed by a plurality of subsequent material-removing processing steps. These processing steps are necessary in order to obtain the smoothest possible surfaces and parallel sides of the semiconductor wafer, and also to provide the semiconductor wafer with a rounded edge. Appropriate material-removing processing steps usually include edge rounding, lapping or double-side grinding, etching, and polishing of the semiconductor wafer. Processing steps such as double-side grinding and primarily lapping add damage to the wafer surface, this damage necessitating a high amount of material removal in subsequent steps (etching, polishing).

The crystal damage can be reduced by fine grinding of the semiconductor wafer, that is to say by surface grinding using a grinding disk having a fine grain size. Less material removal is then necessary during subsequent etching. Ideally, the intention is to completely dispense with the etching step. Such a reduced etching step is intended to have the effect that impairment of the flatness of the semiconductor wafer that is usually associated with etching is reduced, and less material removal is in turn necessary in the subsequent polishing step. A fine grinding method of this type is described in DE 102 005 012 446 A1.

However, fine grinding also disadvantageously influences the geometry and, in particular, also the nanotopology, which is becoming more and more problematic on account of the constantly increasing requirements made of these two parameters in the course of further miniaturization (Roadmap, Design Rules). The nanotopology is usually expressed as height fluctuation PV ("peak to valley"), relative to square measurement windows having an area of 2 mm×2 mm. Moreover, a conventional fine grinding process by which the wafer situated on a rotating wafer holder and a rotating disk are delivered to one another (advance) cannot readily be employed in view of the forces acting on 450 mm wafers according to the current situation.

SUMMARY

An object of the present invention is to provide suitable process sequences for producing semiconductor wafers and new processing steps which curb the disadvantages of both the fine grinding used previously and also of conventional coarse grinding steps (PPG, DDG) and lapping, and which at the same time are suitable for 450 mm wafers. These and other objects are achieved by processing a wafer between rotating ring-shaped disks containing abrasive material, while supplying an alkaline medium containing no abrasive material.

BRIEF DESCRIPTION OF THE DRAWINGS

FIG. 1 illustrates the influence of pH of the grinding liquid medium with overall average material removal and removal in the center of the wafer.

DETAILED DESCRIPTION OF THE PREFERRED EMBODIMENTS

The invention is thus achieved by means of a method for processing a semiconductor wafer on both sides simultaneously, the semiconductor wafer lying in freely movable fashion in a cutout in one of a plurality of carriers that are caused to rotate by means of a rolling apparatus, and thereby being moved on a cycloidal trajectory, the semiconductor wafer being processed in material-removing fashion between two rotating ring-shaped working disks, wherein each working disk comprises a working layer comprising abrasive material, wherein an alkaline medium comprising no abrasive material is supplied during the processing.

The invention is also achieved by means of a method for producing a semiconductor wafer, comprising:

a) Providing a cylindrically ground rod of semiconductor material;
b) Slicing a semiconductor wafer from the rod;
c) Rounding the edge of the semiconductor wafer;
d) Processing the two surfaces of the semiconductor wafer;
e) Cleaning the semiconductor wafer; and
f) Polishing the two sides of the semiconductor wafer;

wherein at least one step of chemically grinding both sides of the semiconductor wafer is effected in which the semiconductor wafer lies in freely movable fashion in a cutout in one of a plurality of carriers that are caused to rotate by means of a rolling apparatus, and is thereby moved on a cycloidal trajectory, wherein the semiconductor wafer is processed in material-removing fashion between two rotating ring-shaped working disks, wherein each working disk comprises a working layer comprising abrasive material, and an alkaline medium comprising no abrasive material is supplied between working disks and semiconductor wafers during the processing.

The preferred areas of use of chemical grinding in the manufacturing sequence provide for:

a) replacing the previous methods of mechanical coarse removal, namely DDG, PPG and lapping, or
b) replacing the previous step of mechanical fine removal, that is to say conventional fine grinding, or
c) a combination of a) and b). Purely mechanical material removal no longer takes place in this case c). All the methods for processing the surfaces of semiconductor wafers are then chemical (cleaning, possibly etching) and chemomechanical (polishing) in nature (apart from the still necessary mechanical processing of the edge of the semiconductor wafer, e.g. to say the edge rounding).

The following manufacturing sequences are particularly preferred in the context of the invention; in all the sequences, a rod-type crystal that has been grown by means of CZ (Czochralski) or FZ (float zone) and has been cylindrically ground is present as the starting product:

a) Wire sawing-edge rounding-chemical grinding (coarse)-cleaning-edge rounding-laser mark-etching-double-side polishing (DSP)-edge polishing;
b) Wire sawing-double-side coarse grinding (DDG)-edge rounding-laser mark-chemical grinding (fine)-cleaning-double-side polishing-edge polishing;
c) Wire sawing-edge rounding-double-side coarse grinding (PPG)-cleaning-edge rounding-laser mark-chemical grinding (fine)-cleaning-double-side polishing-edge polishing;
d) Wire sawing-edge rounding-lapping-cleaning-edge rounding-laser mark-chemical grinding (fine)-etching-DSP-edge polishing;
e) Wire sawing-edge rounding-lapping-cleaning-edge rounding-laser mark-fine grinding-chemical grinding (fine)-cleaning-DSP-edge polishing;
f) Wire sawing-edge rounding-chemical grinding (coarse)-cleaning-edge rounding-laser mark-chemical grinding (fine)-cleaning-DSP-edge polishing.

These preferred sequences usually contain an edge rounding step divided into two. This can involve e.g. a first coarse grinding step and a second fine grinding step. However, it is equally preferred to provide only one edge rounding step, which can be performed before or after the mechanical coarse grinding, lapping or chemical coarse grinding step.

If mention is made of a cleaning step in the sequences, etching steps that lead to a not insignificant material removal are excluded. A cleaning step after lapping or chemical grinding steps serves to free the processed wafer of residues of the lapping slurry or of the abrasive. Material removal for eliminating possible damage is not provided.

After the edge polishing, in the exemplary sequences, further processing and treatment steps can take place, e.g. a chemical mechanical haze-free polishing (CMP) using a soft polishing pad, deposition of an epitaxial layer or else a thermal treatment (anneal, RTA), in order to set specific defect properties in the bulk (internal getters, denuded zone, BMD densities).

The starting point is in each case a cylindrically ground rod of semiconductor material. Monocrystalline silicon is preferably involved. Monocrystalline silicon, particularly in the case of silicon rods having large diameters (>=300 mm), is usually grown by means of the so-called Czochralski (CZ) method. This involves bringing a seed crystal to the surface of silicon melted in a quartz crucible and slowly pulling it upward. In this case, firstly a neck is produced, and the pulling rate is reduced and a conical region is shaped, which merges into a cylindrical region of the crystal.

After the pulling of the single crystal, beginning and end cones are preferably sliced off. The crystal piece is then ground cylindrically, parallel to a defined crystal direction. In this case, the single crystal piece is arranged in such a way that the desired crystal orientation is defined by the pressure members applied at the ends. A corresponding method for oriented cylindrical grinding and a suitable apparatus are disclosed in the European patent specification EP 0 962 284 B1.

In accordance with step b) of the process sequence according to the invention, the cylindrically ground single crystal is sliced into wafers. A wire saw is preferably used for this purpose. During wire sawing, a multiplicity of wafers are sliced from a crystal piece in one work operation. U.S. Pat. No. 5,771,876 describes the functional principle of such a wire saw. Wire saws have a wire gang formed by a sawing wire wound around two or more wire guide or deflection rolls. The sawing wire can be coated with an abrasive coating. When using wire saws having a sawing wire without a fixedly bonded abrasive grain, abrasive grain is supplied in the form of a slurry during the slicing process. In the course of the slicing process, the crystal piece fixed on a table penetrates through the wire gang in which the sawing wire is arranged in the form of wire sections lying parallel alongside one another. The penetration of the wire gang is brought about by means of a relative movement between table and wire gang, this relative movement being realized by means of a feed device and guiding the crystal piece toward the wire gang (table advance) or the wire gang toward the crystal piece.

Edge rounding is effected in step c) of the process sequence according to the invention. In this case, the edge of the semiconductor wafer including any existing mechanical markings such as an orientation notch or a substantially rectilinear flattening of the wafer edge ("flat") are also processed ("edge-notch-grinding"). Conventional grinding steps with profiled grinding disks, belt grinding methods with continuous or periodic tool advance or integrated edge rounding methods (edge grinding and edge polishing in one step) are used for this purpose. These edge rounding methods are necessary since the edge in the unprocessed state is particularly fracture-sensitive and the semiconductor wafer can be damaged even by slight pressure and/or temperature loads in the edge region.

Step e) of the sequence according to the invention comprises cleaning steps, which may be necessary at a number of points in a manufacturing sequence. By way of example, such a cleaning step usually takes place before and after DSP.

Both sides of the semiconductor wafer are polished in step f) of this sequence according to the invention. A conventional DSP can preferably be involved in this case. This can also be followed by a CMP polishing process in order to polish one side of the semiconductor wafer in a haze-free manner. It is likewise preferred at this point, instead of DSP, to process the semiconductor wafer on both sides sequentially using a special polishing pad containing bonded abrasive substances such as cerium, silica, etc., in contrast to CMP polishing pads. Sequential processing of front and rear sides of the wafer is advantageous, particularly for 450 mm wafers.

Processing of both surfaces of the semiconductor wafer takes place in step d) of the sequence according to the invention. This preferably involves a lapping step or double-side grinding (PPG or DDG). However, a chemical coarse grinding step that acts mechanically and chemically can also be involved. According to the invention it is essential to provide at least one chemical grinding step. This can involve a chemical fine grinding step, referred to as chemical grinding (fine) in the exemplary sequences. However, it is also preferred to provide a chemical coarse grinding step. The latter then preferably corresponds to step d) of the manufacturing sequence according to the invention and replaces DDG, PPG or lapping.

In the prior art, the semiconductor wafers were processed before DSP by means of grinding methods with purely mechanical action or by means of lapping. On account of the purely mechanical removal behavior and the resulting high effective forces, significant damage to the crystal lattice occurs at the surface and in the adjoining layers near the surface, which necessitates subsequent steps such as e.g. an etching process and long removal polishing times (DSP) or a reduced etching process in combination with an additional finer mechanical grinding process (e.g. fine grinding) before DSP.

The present invention is based on the fact that in the case of a combination of a mechanical removal step, e.g. in the form of grinding using bonded grain, with a simultaneous chemical removal by means of chemicals with alkaline action, the mechanical proportion (pressure, grain size) of the removal is correspondingly reduced since the layers of the crystal lattice which are near the surface interact with the chemical and are weakened by this, which has the effect that less mechanical force action is required to remove the crystal layers.

Preferred chemicals for carrying out the chemical grinding step are alkaline buffer solutions. The pH value of the alkaline medium preferably varies in a range of 11.8 to 12.5. Preferably, the alkaline medium contains compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred. Such a $K_2CO_3$ solution is preferably used in combination with other alkaline components, such as e.g. KOH or TMAH. The addition of chemical buffer solution should be at least 0.2% by weight. A proportion of 4-10% by weight is particularly preferred.

The alkaline medium can furthermore contain one or more further additives, for example surface-active additives such as wetting agents and surfactants, stabilizers acting as protective colloids, preservatives, biocides, alcohols and complexing agents.

The abrasive substance of the working layers of the working disks is composed of a material that mechanically removes the substrate material (semiconductor material, e.g. silicon). The abrasive substance is preferably selected from a group consisting of oxides of the elements aluminum, cerium, zirconium and silicon. The use of diamond, boron nitride or silicon carbide as an abrasive substance is likewise preferred.

If the chemical grinding is effected as a coarse grinding step, working layers containing abrasives having a grain size of less than #2000, in particular #200-#2000, are used (grain size mesh according to Japanese Industrial Standard JIS R 6001:1998). If the chemical grinding is effected as a fine grinding step, working layers containing abrasive having a fine grain size of #2000 or finer, in particular #2000-#8000, are used.

The working layer can be used in the form of a pad which is stuck to the working disk and which contains an abrasive substance bonded in the pad. Particularly suitable abrasive pads have a surface topography shaped by replicated microstructures. These microstructures ("posts") have for example the form of pillars having a cylindrical or polygonal cross section or the form of pyramids or truncated pyramids. Polishing pads of this type are commercially available. More detailed descriptions of such polishing pads are contained for example in WO 92/13680 A1 and US 2005/227590 A1.

Such a mechanical-chemical removal step combines the positive properties of the grinding technique, such as e.g. the production of an outstanding geometry, with the elimination of the disadvantages associated therewith (high damage). This opens up the possibility of dispensing with additional costly process steps (etching or fine grinding+reduced etching) or significantly reducing these steps, and therefore also eliminating the unfavorable effects thereof on geometry (etching) and nanotopology (etching) of the wafer. Particularly when processing large wafers e.g. having a diameter of 450 mm, grinding without an advance on horizontally oriented plates with optimized media supply affords great advantages.

Suitable substrates which are polished according to the invention include, in particular, semiconductor wafers composed of materials such as silicon, gallium arsenide, $Si_xGe_{1-x}$, sapphire and silicon carbide.

Particularly suitable substrates are semiconductor wafers composed of silicon and substrates derived therefrom. The front side of the semiconductor wafer composed of silicon to be polished can be present in a state such as arises after the slicing of the semiconductor wafer from a crystal, after lapping of the semiconductor wafer, after grinding of the semiconductor wafer, after etching of the semiconductor wafer, or after a semiconductor wafer polishing that has already been effected.

A substrate derived from a semiconductor wafer composed of silicon should be understood to include, in particular, substrates having a layer structure, for example semiconductor wafers having a layer deposited by means of epitaxy, SOI substrates ("Silicon On Insulator") and sSOI substrates (Strained Silicon On Insulator) and corresponding intermediate products (e.g. SGOI="Silicon-Germanium On Insulator") thereof. This list is not limiting.

The intermediate products also include donor semiconductor wafers from which layers have been transferred to other substrates, in particular in the course of producing SOI substrates. In order to be able to be reused, the surface of the donor semiconductor wafer that is uncovered by the layer transfer, this surface being comparatively rough and having a characteristic step in the edge region, has to be smoothed.

The surfaces of the substrates to be polished need not or not only consist of silicon. By way of example, layers comprising a III-V compound semiconductor such as gallium arsenide or an alloy composed of silicon and germanium ($Si_xGe_{1-x}$) may be involved.

The invention makes it possible to relieve the burden on the polishing step, which is indispensable for the end product, by means of an optimal precursor product in the form of a chemically ground wafer having excellent geometry and minimal damage such that the polishing primarily fulfils its actual task, namely the optimization of the wafer surface (freedom from scratches, freedom from defects, low roughness) while ensuring good nanotopology and maintaining the optimal initial geometry. This can be realized in appropriately short polishing times.

The method is particularly suitable for machine types having plane (polishing) plates and corresponding (polishing) media distributors such as are customarily used for polishing machines. Conventional double-side polishing machines are particularly suitable for the method described. The method can therefore also be referred to as chemical double-side plane grinding with planetary kinematics.

EXAMPLE

Polishing pads with abrasive particles of cerium oxide ($CeO_2$) fixedly bonded therein, as described e.g. in U.S. Pat. No. 6,602,117 B1 were used for the exemplary embodiment. The average particle size was 0.1-1 µm.

Removal tests were conducted with different mixtures of chemicals on a single-plate polishing machine with a horizontally oriented polishing plate. The different mixtures of chemicals created different pH values, such that a particularly suitable range for the pH value of the alkaline medium was able to be found by evaluating the different removal rates. The mechanical process parameters were identical for all the experiments and can be found in Table 1. The experiments were carried out on a polishing machine from Strasbaugh Inc. of the "nHance 6EG" type.

FIG. 1 illustrates the relationship between pH value of the alkaline abrasive medium, removal rates and temperature during chemical grinding.

1 shows the average removal rate on the wafer, and 2 shows the removal in the center of the wafer, in each case in µm/min.

It is found that a pH value of 11.8 to 12.5 leads to a particularly high removal rate. If an alkaline solution in this pH value range is used, the mechanical part of the removal (the grinding removal) can be reduced, thus resulting in minimal damage to the crystal lattice. The pH values of 11.8 to 12.5 are achievable on the one hand by additions of KOH (0.03 or 0.08% by weight), on the other hand by addition of $K_2CO_3$ (4% by weight). In the case of the solutions having low pH values (pH<11.8), the solutions exclusively contained $K_2CO_3$ (0.2 or <4% by weight). The flow rate of the alkaline medium was 300 ml/min in each case.

While exemplary embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. In a method for processing a semiconductor wafer on both sides simultaneously, said semiconductor wafer lying in freely movable fashion in a cutout in one of a plurality of carriers that are caused to rotate by means of a rolling apparatus and thereby being moved on a cycloidal trajectory in fine grinding fashion between two rotating ring-shaped working disks, wherein the improvement comprises covering each working disk with a working layer comprising abrasive material, and supplying an alkaline medium comprising no abrasive material during processing, such that material is chemomechanically removed from said semiconductor wafer.

2. The method of claim 1, wherein the alkaline medium comprises an aqueous solution of a compound selected from the group consisting of sodium carbonate ($Na_2CO_3$), potassium carbonate ($K_2CO_3$), sodium hydroxide (NaOH), potas-

TABLE 1

| Polishing pressure [psi] | Zone pressures 1, 2 [psi] | Rotational speed ratio carrier/plate | Retainer ring contact pressure [psi] | KOH [ml/min] | K2CO3 [ml/min] | pH |
|---|---|---|---|---|---|---|
| 4 | 2:2 | 33:30 | 2 | — | 300 (0.2 w % $K_2CO_3$) | 11.13 |
| 4 | 2:2 | 33:30 | 2 | — | 300 (4.0 w % $K_2CO_3$) | 11.82 |
| 4 | 2:2 | 33:30 | 2 | 300 (0.03 w % KOH) | 300 (4.0 w % $K_2CO_3$) | 12.16 |
| 4 | 2:2 | 33:30 | 2 | 300 (0.08 w % KOH) | 300 (4.0 w % $K_2CO_3$) | 12.46 |

The polishing machine from Strasbaugh Inc. has one polishing plate with one polishing pad and one polishing head, which processes a semiconductor wafer fully automatically. The polishing head is mounted cardanically and comprises a fixed baseplate coated with a "backing pad", and a movable retainer ring. Through holes in the baseplate, air cushions can be established in two concentric pressure zones, an inner and an outer zone, the semiconductor wafer floating on the air cushions during polishing. Pressure can be applied to the movable retainer ring by means of compressed air bellows in order thus to pretension the polishing pad upon contact with the semiconductor wafer and to keep it planar.

sium hydroxide (KOH), ammonium hydroxide ($NH_4OH$), tetramethylammonium hydroxide (TMAH), and mixtures thereof.

3. The method of claim 2, wherein the pH of the aqueous solution is 11.8 to 12.5 and the proportion of the compounds in the aqueous solution is 0.2 to 10% by weight.

4. The method of claim 3, wherein the proportion of the compounds in the aqueous solution is 4 to 10% by weight.

5. The method of claim 1, wherein the working layers contain abrasive substances selected from one or more of the oxides of the group consisting of aluminum, zirconium, cerium and silicon.

6. The method of claim 1, wherein the working layers contain particles of one or more of the hard materials selected from the group consisting of silicon carbide, boron nitride and diamond.

7. The method of claim 1, wherein the semiconductor wafer is a silicon wafer having a diameter of 300 mm or greater.

8. A method for producing a semiconductor wafer, comprising:
   a) Providing a cylindrically ground rod of semiconductor material;
   b) Slicing a semiconductor wafer from the rod;
   c) Rounding the edge of the semiconductor wafer;
   d) Processing both surfaces of the semiconductor wafer;
   e) Cleaning the semiconductor wafer; and
   f) Polishing both sides of the semiconductor wafer; wherein at least one step of processing both sides of the semiconductor wafer is effected by the method of claim 1.

9. The method of claim 8, wherein the alkaline medium involves aqueous solutions of the compounds selected from the group consisting of sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), and mixtures thereof.

10. The method of claim 9, wherein the pH of the aqueous solution is 11.8 to 12.5 and the proportion of the compounds in the aqueous solution is 0.2 to 10% by weight.

11. The method of claim 10, wherein the proportion of the compounds in the aqueous solution is 4 to 10% by weight.

12. The method of claim 8, wherein the working layers contain one or more abrasive substances selected from one or more of the group consisting of the oxides aluminum, zirconium, cerium and silicon.

13. The method of claim 8, wherein the working layers contain particles of one or more of hard materials selected from the group consisting of silicon carbide, boron nitride and diamond.

14. The method of claim 8, wherein the semiconductor wafer is a silicon wafer having a diameter of 300 mm or greater.

15. The method of claim 8, wherein after a process of rounding the edge of the semiconductor wafer in accordance with c), both sides of the semiconductor wafer are ground chemically, wherein the working layers have a granulation of less than #2000.

16. A method for producing a semiconductor wafer, comprising:
   a) Providing a cylindrically ground rod of semiconductor material;
   b) Slicing a semiconductor wafer from the rod;
   c) Rounding the edge of the semiconductor wafer;
   d) Processing both surfaces of the semiconductor wafer;
   e) Cleaning the semiconductor wafer; and
   f) Polishing both sides of the semiconductor wafer; wherein at least one step of processing both sides of the semiconductor wafer is effected by chemomechanically removing material from both sides of the semiconductor wafer simultaneously by means of a process wherein said semiconductor wafer lies in freely movable fashion in a cutout in one of a plurality of carriers that are caused to rotate by means of a rolling apparatus and thereby moved on a cycloidal trajectory between two rotating ring-shaped working disks, each working disk having a working layer comprising abrasive material, and supplying an alkaline medium comprising no abrasive material during processing,
   wherein the process of rounding the edge in accordance with step c) is effected after step d), the processing in accordance with step d) corresponds to a simultaneous double-side grinding without supply of an alkaline medium and using grinding disks having coarse granulation, and the semiconductor wafer that has been ground on both sides and edge-rounded in this way is ground chemically on both sides, wherein the working layers have a granulation of #2000-#8000.

17. The method of claim 16, wherein edge rounding in accordance with step c) is effected both before and after step d).

18. The method of claim 16, wherein the simultaneous double-side grinding is replaced by a lapping of the semiconductor wafer on both sides.

19. The method of claim 18, wherein, before the process of chemically grinding both sides of the semiconductor wafer, a process of grinding both sides of a semiconductor wafer is effected by means of grinding disks having the granulation #2000-8000, wherein no alkaline medium is supplied during this grinding step.

20. A method for producing a semiconductor wafer, comprising:
   a) Providing a cylindrically ground rod of semiconductor material;
   b) Slicing a semiconductor wafer from the rod;
   c) Rounding the edge of the semiconductor wafer;
   d) Processing both surfaces of the semiconductor wafer;
   e) Cleaning the semiconductor wafer; and
   f) Polishing both sides of the semiconductor wafer; wherein at least one step of processing both sides of the semiconductor wafer is effected by chemomechanically removing material from both sides of the semiconductor wafer simultaneously by means of a process wherein said semiconductor wafer lies in freely movable fashion in a cutout in one of a plurality of carriers that are caused to rotate by means of a rolling apparatus and thereby moved on a cycloidal trajectory between two rotating ring-shaped working disks, each working disk having a working layer comprising abrasive material, and supplying an alkaline medium comprising no abrasive material during processing,
   wherein in step d) both sides of the semiconductor wafer are ground chemically, wherein the working layers have a granulation of less than #2000, an edge rounding step in accordance with c) is effected both before and after step d), and the semiconductor wafer that has been ground on both sides and edge-rounded in this way is ground chemically on both sides a second time, wherein the working layers then have a granulation of #2000-#8000.

* * * * *